(12) United States Patent
Huang et al.

(10) Patent No.: US 12,513,925 B2
(45) Date of Patent: Dec. 30, 2025

(54) INSULATED GATE BIPOLAR TRANSISTOR, MOTOR CONTROL UNIT, AND VEHICLE

(71) Applicant: HUAWEI TECHNOLOGIES CO., LTD., Guangdong (CN)

(72) Inventors: Boning Huang, Dongguan (CN); Quan Zhang, Shenzhen (CN); Wentao Yang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 456 days.

(21) Appl. No.: 17/946,111

(22) Filed: Sep. 16, 2022

(65) Prior Publication Data

US 2023/0018508 A1    Jan. 19, 2023

Related U.S. Application Data

(63) Continuation of application No. PCT/CN2020/079555, filed on Mar. 17, 2020.

(51) Int. Cl.
*H10D 12/00*     (2025.01)
*H10D 62/17*     (2025.01)
(Continued)

(52) U.S. Cl.
CPC ......... *H10D 12/411* (2025.01); *H10D 62/393* (2025.01); *H10D 64/231* (2025.01); *H10D 64/281* (2025.01); *H02P 25/16* (2013.01)

(58) Field of Classification Search
CPC .. H10D 62/393; H10D 64/231; H10D 64/281; H10D 64/232; H10D 30/668;
(Continued)

(56) References Cited

U.S. PATENT DOCUMENTS

2009/0114985 A1    5/2009    Akagi et al.
2010/0038712 A1*   2/2010    Watanabe ............ H10D 62/111
                                                           257/341
(Continued)

FOREIGN PATENT DOCUMENTS

CN    103219370 A    7/2013
CN    102569354 B1   2/2015
(Continued)

OTHER PUBLICATIONS

International Search Report and Written Opinion of the ISA, dated Dec. 16, 2020 issued for International Application No. PCT/CN2020/079555 (11 pages).
(Continued)

*Primary Examiner* — Shahed Ahmed

(57) ABSTRACT

An insulated gate bipolar transistor (IGBT), a motor control unit, and a vehicle are disclosed. The insulated gate bipolar transistor includes three device structure feature layers that are laminated. An IGBT device structure feature layer and an RC-IGBT device structure feature layer are respectively arranged on two sides of an SJ device structure feature layer. The RC-IGBT device structure feature layer includes a collector and a drain that are disposed at a same layer. The insulated gate bipolar transistor further includes a first metal electrode laminated with and electrically connected to the collector, and a second metal electrode laminated with and electrically connected to the drain, and the first metal electrode is electrically isolated from the second metal electrode.

19 Claims, 4 Drawing Sheets

(51) Int. Cl.
   *H10D 64/23* (2025.01)
   *H10D 64/27* (2025.01)
   *H02P 25/16* (2006.01)

(58) Field of Classification Search
   CPC .. H10D 12/481; H10D 84/141; H10D 62/142; H10D 12/411–491; H10D 12/031–038; H10D 62/141–148; H10D 84/40–409; H10D 62/109–111; H02P 25/16
   See application file for complete search history.

(56) References Cited

U.S. PATENT DOCUMENTS

| | | | |
|---|---|---|---|
| 2012/0153348 A1 | 6/2012 | Aono et al. | |
| 2015/0129930 A1 | 5/2015 | Aono et al. | |
| 2017/0345917 A1* | 11/2017 | Basler | H03K 17/127 |

FOREIGN PATENT DOCUMENTS

| | | | | |
|---|---|---|---|---|
| CN | 104350602 A | | 2/2015 | |
| CN | 107039419 A | | 8/2017 | |
| CN | 107464842 A | * | 12/2017 | ......... H01L 29/0603 |
| CN | 107768429 A | | 3/2018 | |
| CN | 109888005 A | | 6/2019 | |
| JP | 2010074051 A | | 4/2010 | |
| JP | 2010251793 A | | 11/2010 | |
| JP | 4815885 B2 | | 11/2011 | |
| JP | 2012142537 A | | 7/2012 | |
| JP | 2016149430 A | | 8/2016 | |
| JP | 2016225583 A | | 12/2016 | |

OTHER PUBLICATIONS

Extended European Search Report dated Mar. 9, 2023 issued for European Application No. 20926062.9 (9 pages).
Office Action issued in JP2022-556190, dated Oct. 31, 2023 with English Translation, 6 pages.

* cited by examiner

INSULATED GATE BIPOLAR TRANSISTOR, MOTOR CONTROL UNIT, AND VEHICLE

CROSS-REFERENCE TO RELATED APPLICATIONS

This application is a continuation of International Application No. PCT/CN2020/079555, filed on Mar. 17, 2020, the disclosure of which is hereby incorporated by reference in its entirety.

TECHNICAL FIELD

This application relates to the field of electrical technologies, and in particular, to an insulated gate bipolar transistor, a motor control unit, and a vehicle.

BACKGROUND

An MCU (Motor Control Unit) of an electric vehicle usually uses an IGBT (Insulated Gate Bipolar Transistor) as a switching element, to convert a direct current (DC) output by a battery into an alternating current (AC) to drive a motor. How to improve conversion efficiency of an inverter to prolong use time of a battery is always a direction in which developers of inverters and power semiconductor devices make efforts.

The IGBT is a composite fully-controlled voltage-driven power semiconductor device including a MOSFET (Metal-Oxide-Semiconductor Field-Effect Transistor) and a BJT (bipolar junction transistor). The IGBT has advantages of both a high input impedance of the MOSFET and a low conduction voltage drop of the BJT, and is a power semiconductor device suitable for medium and high power applications. In an inverter of the electric vehicle, the IGBT needs to be used together with an FRD. To reduce a total loss of the switching element to improve conversion efficiency of the MCU, a device designer performs chip integration on the IGBT and the FRD, and proposes an RC-IGBT (Reverse-Conduction Insulated Gate Bipolar Transistor, reverse-conduction IGBT) structure, so that the device has a higher cutoff speed and a better Vcesat-Eoff tradeoff relationship. However, the MCU of the electric vehicle operates in a light load state most of time. Regardless of whether an RC-IGBT or an SJ-RC-IGBT is used as the switching element, a control chip cannot accurately control an operating mode of the switching element based on an operating status of the MCU, affecting further improvement of conversion efficiency of the MCU.

SUMMARY

This application provides an insulated gate bipolar transistor, a motor control unit, and a vehicle, to improve a control effect of the insulated gate bipolar transistor.

According to a first aspect, an insulated gate bipolar transistor is provided. The insulated gate bipolar transistor is applied to a motor control unit. A laminated multi-layer structure of the insulated gate bipolar transistor includes, for example, an IGBT device structure feature layer, a super-junction (SJ) device structure feature layer, and an RC-IGBT device structure feature layer, and the IGBT device structure feature layer and the RC-IGBT device structure feature layer are respectively arranged on two sides of the SJ device structure feature layer. The RC-IGBT device structure feature layer includes a collector and a drain that are disposed at a same layer. The insulated gate bipolar transistor further includes a first metal electrode laminated with and electrically connected to the collector, and a second metal electrode laminated with and electrically connected to the drain, and the first metal electrode is electrically isolated from the second metal electrode. In the foregoing solution, the first metal electrode and the second metal electrode may be respectively connected to the collector and the drain, and power may be separately supplied to the collector and the drain, so that a power supply manner of the insulated gate bipolar transistor is added, thereby improving a control manner of the insulated gate bipolar transistor.

In a specific implementable solution, the SJ device structure feature layer includes a drift layer, a super-junction structure layer, and a buffer layer that are laminated, and the super-junction structure layer is located between the drift layer and the buffer layer. The drift layer is connected to the IGBT device structure feature layer. The buffer layer is connected to the collector and the drain.

In a specific implementable solution, the buffer layer is an N-type buffer layer.

In a specific implementable solution, the drift layer is an N-drift layer.

In a specific implementable solution, the super-junction structure layer includes a plurality of N-drift layers and a plurality of P-drift layers, the plurality of N-drift layers and the plurality of P-drift layers are alternately arranged in a first direction, and the first direction is perpendicular to a second direction.

The second direction is a direction in which the IGBT device structure feature layer is laminated with the SJ device structure feature layer.

In a specific implementable solution, the IGBT device structure feature layer includes:
a P base layer laminated with the drift layer, and a front emitter laminated with the P base layer; and
a plurality of gates that are penetrated through the P base layer and inserted into the drift layer, an insulating gate film that wraps each gate, an interlayer insulating film that insulates each gate from the front emitter, and an N emitter layer and a P+ contact layer that are disposed on a surface of the P base layer.

In a specific implementable solution, the first metal electrode is in ohmic contact with the collector; and/or the second metal electrode is in ohmic contact with the drain.

In a specific implementable solution, the first metal electrode is separated from the second metal electrode by a specified distance.

In a specific implementable solution, there are a plurality of collectors and a plurality of drains, and the plurality of collectors and the plurality of drains are alternately arranged.

In a specific implementable solution, first metal electrodes are in a one-to-one correspondence with the collectors, second metal electrodes are in a one-to-one correspondence with the drains, and any adjacent first metal electrode and second metal electrode are electrically isolated from each other.

According to a second aspect, a motor control unit is provided. The motor control unit includes a power module and the insulated gate bipolar transistor that is connected to the power module and that is described in any one of the foregoing solutions. In the foregoing solution, the first metal electrode and the second metal electrode may be respectively connected to the collector and the drain, and power may be separately supplied to the collector and the drain, so that a power supply manner of the insulated gate bipolar transistor is added, thereby improving a control manner of the insulated gate bipolar transistor.

According to a third aspect, a vehicle is provided. The vehicle includes a motor and a motor control unit that is connected to the motor and that is described in any one of the foregoing solutions. In the foregoing solution, the first metal electrode and the second metal electrode may be respectively connected to the collector and the drain, and power may be separately supplied to the collector and the drain, so that a power supply manner of the insulated gate bipolar transistor is added, thereby improving a control manner of the insulated gate bipolar transistor.

DESCRIPTION OF EMBODIMENTS

To make the objectives, technical solutions, and advantages of this application clearer, the following further describes this application in detail with reference to the accompanying drawings.

First, an application scenario of an insulated gate bipolar transistor provided in an embodiment of this application is described. The insulated gate bipolar transistor provided in this embodiment is applied to a motor control unit. For example, an MCU (Motor Control Unit) of an electric vehicle usually uses an IGBT (Insulated Gate Bipolar Transistor) as a switching element, to convert a direct current (DC) output by a battery into an alternating current (AC) to drive a motor. The IGBT is a composite fully-controlled voltage-driven power semiconductor device including a MOSFET (metal-oxide-semiconductor field-effect transistor) and a BJT (bipolar junction transistor). The IGBT has advantages of both a high input impedance of the MOSFET and a low conduction voltage drop of the BJT, and is a power semiconductor device suitable for medium and high power applications. In an inverter of the electric vehicle, the IGBT needs to be used together with an FRD. To reduce a total loss of the switching element to improve conversion efficiency of the MCU, a device designer performs chip integration on the IGBT and the FRD, and proposes an RC-IGBT structure, so that the device has a higher cutoff speed and a better Vcesat-Eoff tradeoff relationship. However, in the conventional technology, regardless of whether an RC-IGBT or an SJ-RC-IGBT is used as the switching element, a control chip cannot accurately control an operating mode of the switching element based on an operating status of the MCU. In view of this, an embodiment of this application provides an insulated gate bipolar transistor. The following describes the insulated gate bipolar transistor with reference to specific accompanying drawings.

Figure 1:
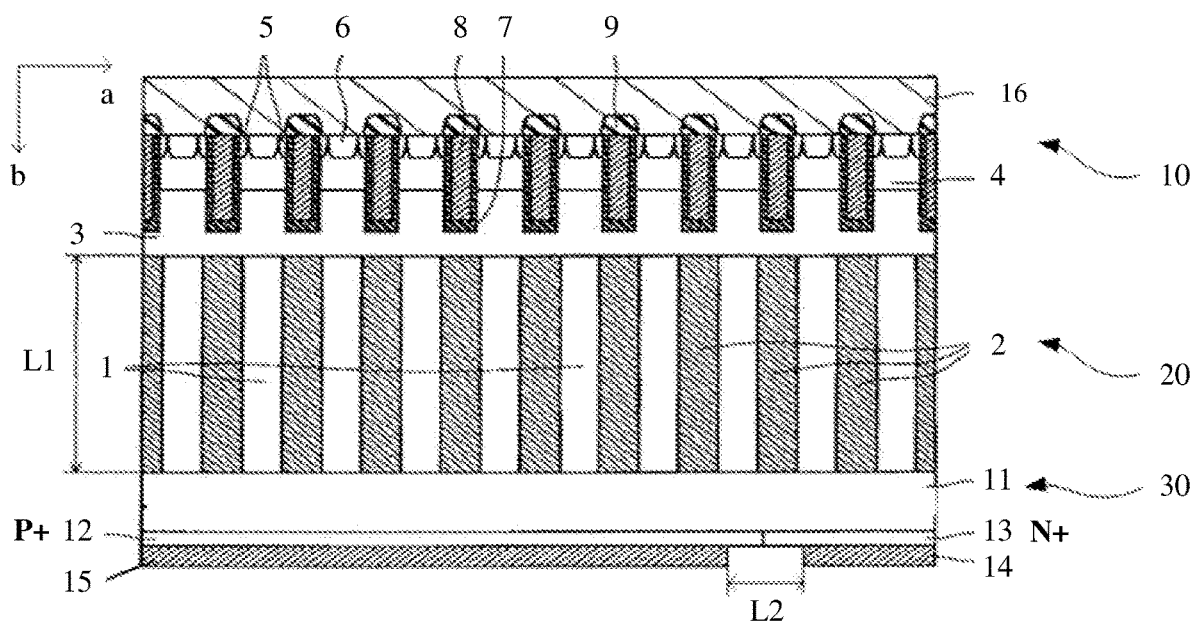
FIG. 1 is a cross-sectional view of an insulated gate bipolar transistor according to an embodiment of this application.

FIG. 1 is a cross-sectional view of an insulated gate bipolar transistor according to an embodiment of this application.

The insulated gate bipolar transistor provided in this embodiment mainly includes three structures: an IGBT device structure feature layer 10, an SJ device structure feature layer 20, and an RC-IGBT device structure feature layer 30. The IGBT device structure feature layer 10, the SJ device structure feature layer 20, and the RC-IGBT device structure feature layer 30 are laminated in a vertical direction in FIG. 1, and the IGBT device structure feature layer 10 and the RC-IGBT device structure feature layer 30 are respectively arranged on two sides of the SJ device structure feature layer 20.

For ease of description, a first direction a and a second direction b are defined. The second direction b is a direction in which the IGBT device structure feature layer 10 and the SJ device structure feature layer 20 are laminated, and the first direction a is perpendicular to the second direction b.

As shown in FIG. 1, the SJ device structure feature layer 20 mainly includes a drift layer 3, a super-junction structure layer, and a buffer layer 11 that are laminated, and the super-junction structure layer is located between the drift layer 3 and the buffer layer 11. The buffer layer 11 is an N-type buffer layer. During preparation, a super-junction structure and the drift layer 3 are formed on a first surface of the buffer layer 11. The super-junction structure includes a plurality of N-drift layers 1 and a plurality of P-drift layers 2, and the plurality of N-drift layers 1 and the plurality of P-drift layers 2 are alternately arranged in the first direction a. The N-drift layer 1 and the P-drift layer 2 are formed by using injection, diffusion, and epitaxial growth processes, and both a thickness of the N-drift layer 1 and a thickness of the P-drift layer 2 are set to L1. The drift layer 3 on the super-junction structure is an N-drift layer, and the drift layer 3 is formed on a surface that is of the super-junction structure and that is away from the buffer layer 11.

The IGBT device structure feature layer 10 is connected to the drift layer 3. The IGBT device structure feature layer 10 includes: a P base layer 4 laminated with the drift layer 3 in the second direction b, and a front emitter 16 laminated with the P base layer 4; and a plurality of gates 8 that are penetrated through the P base layer 4 and inserted into the drift layer 3, an insulating gate film 7 that wraps each gate 8, an interlayer insulating film 9 that insulates each gate 8 from the front emitter 16, and an N emitter layer 5 and a P+ contact layer 6 that are disposed on a surface of the P base layer 4. During specific preparation, the P base layer 4 is formed on the drift layer 3, and the N emitter layer 5 and the P+ contact layer 6 are formed on the surface of the P base layer 4. In addition, a trench is formed from a surface of the N emitter layer 5 to a midway close to the drift layer 3 through the P base layer 4, and the gate 8 is formed in the trench by interposing the insulating gate film 7 between the gate 8 and the trench. The insulating gate film 7 is a gate oxide layer, and a polycrystalline silicon gate may be used as the gate 8. The front emitter 16 is formed on the P+ contact layer 6, and the gate 8 is insulated from the front emitter 16 by using the interlayer insulating film 9.

Still referring to FIG. 1, the RC-IGBT device structure feature layer 30 includes a collector 12 and a drain 13 that are disposed at a same layer. During specific preparation, the collector 12 and the drain 13 are formed on a second surface of the buffer layer 11 in the first direction a in FIG. 1. A first metal electrode 15 and a second metal electrode 14 are formed on back surfaces of the collector 12 and the drain 13. The first metal electrode 15 is laminated with and electrically connected to the collector 12, the second metal electrode 14 is laminated with and electrically connected to the drain 13, and the first metal electrode 15 is electrically isolated from the second metal electrode 14.

During specific preparation, the first metal electrode 15 is in ohmic contact with the collector 12 to ensure an electrical connection effect between the first metal electrode 15 and the collector 12. Specifically, electrical connection between the first metal electrode 15 and the collector 12 may be implemented through soldering, or by directly forming the first metal electrode 15 on the collector 12. The second metal electrode 14 is in ohmic contact with the drain 13 to ensure an electrical connection effect between the second metal electrode 14 and the drain 13. Specifically, electrical connection between the second metal electrode 14 and the drain 13 may be implemented through soldering, or by directly forming the second metal electrode 14 on the drain 13.

To ensure electrical isolation between the first metal electrode 15 and the second metal electrode 14, the first metal electrode 15 is separated from the second metal electrode 14 by a specified distance, to ensure an isolation degree between the first metal electrode 15 and the second metal electrode 14. As shown in FIG. 1, the specified distance indicates a horizontal distance L2, in the first direction a, between an end portion of the first metal electrode 15 and an end portion of the second metal electrode 14 that are close to each other. A value of L2 may be determined based on an actual design, and is not specifically limited in this application, provided that an isolation degree between the first metal electrode 15 and the second metal electrode 14 can be ensured.

The first metal electrode 15 may be specifically isolated from the second metal electrode 14 in different manners. For example, the first metal electrode 15 may cover the collector 12 and have an area equal to an area of the collector 12, and the second metal electrode 14 may cover the drain 13 and have an area less than an area of the drain 13; the first metal electrode 15 may cover the collector 12 and have an area less than an area of the collector 12, and the second metal electrode 14 may cover the drain 13 and have an area equal to an area of the drain; or the first metal electrode 15 may cover the collector 12 and have an area less than an area of the collector 12, and the second metal electrode 14 may cover the drain 13 and has an area less than an area of the drain 13.

An operation of the insulated gate bipolar transistor is described. If a positive voltage greater than or equal to a threshold Vth is applied to the gate 8, a region of the P base layer 4 located between the N emitter layer 5 and the drift layer 3 is inverted to an N-type, and an electron is injected from the N emitter layer 5 to the drift layer 3, so that the insulated gate bipolar transistor is conducted forward. In a conducted state, if a voltage that is of the collector 12 and that causes a PN junction between the collector 12 and the buffer layer 11 to have at least a forward bias voltage is applied to the first metal electrode 15 and the second metal electrode 14, an electron hole is injected from the first metal electrode 15 to the drift layer 3 to cause conductance modulation, and resistance values of the N-drift layer 1 and the P-drift layer 2 of the super-junction structure sharply decrease, so that the insulated gate bipolar transistor has an sufficient power-on capability.

In addition, if a negative bias voltage is applied to the gate 8 and a specified voltage is applied between the front emitter 16 and metal electrodes (the first metal electrode 15 and the second metal electrode 14) (a voltage of the front emitter 16<a voltage of the back collector 12), a depletion layer (the super-junction structure) of the insulated gate bipolar transistor in this embodiment extends from the P base layer 4 on a surface to the drift layer 3 and the N-drift layer 1/P-drift layer 2, and the super-junction structure is completely depleted, so that a withstanding voltage can be kept.

Figure 2:
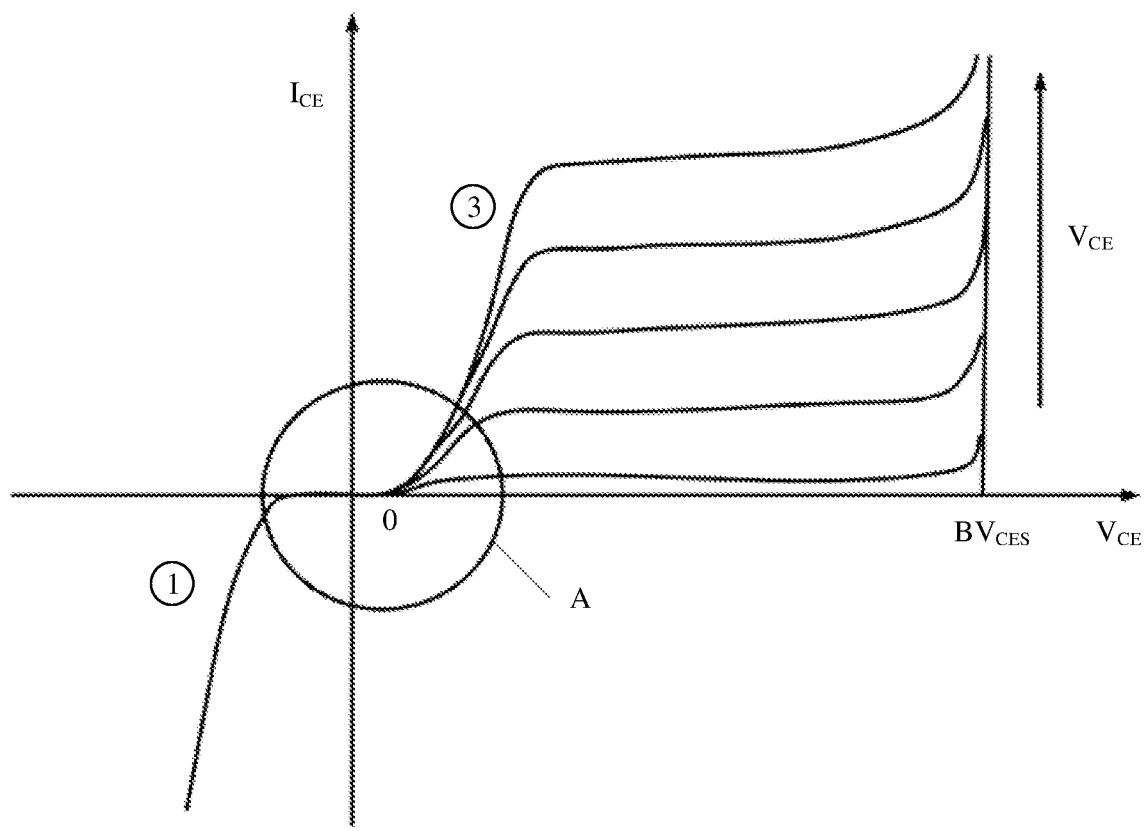
FIG. 2 is a drive voltage corresponding to an operating mode of an insulated gate bipolar transistor according to an embodiment of this application.
Figure 3:
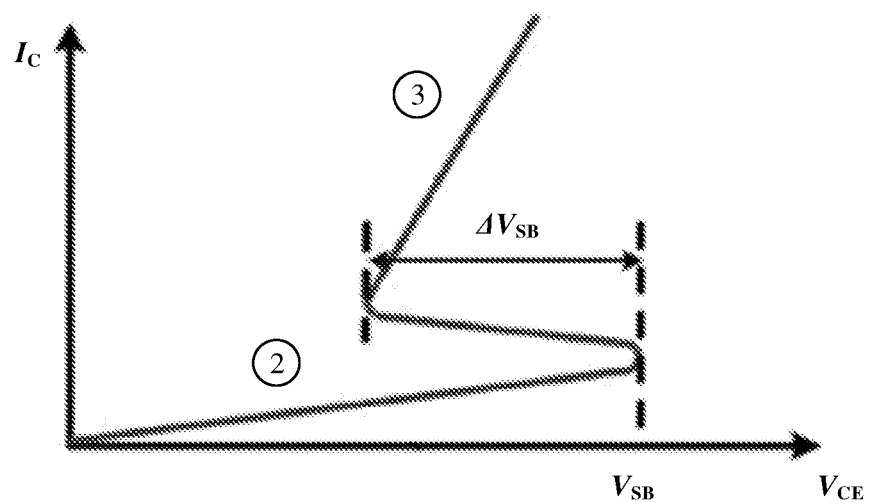
FIG. 3 is a partially enlarged view of the encircled portion labeled as A in FIG. 2.

The insulated gate bipolar transistor mainly has three operating modes: an FRD mode, a MOSFET mode, and an IGBT mode. With reference to FIG. 2 and FIG. 3, the three operating modes of the insulated gate bipolar transistor are described. FIG. 2 shows the three operating modes corresponding to the insulated gate bipolar transistor during operation, and FIG. 3 is a partially enlarged view of the encircled portion labeled as A in FIG. 2, where (1) represents the FRD mode, 2 represents the MOSFET mode, and (3) represents the IGBT mode. It can be seen from FIG. 2 and FIG. 3 that, when power is supplied to both the first metal electrode 15 and the second metal electrode 14, after the gate trench is opened, no electron hole is injected into a back surface of the insulated gate bipolar transistor at a start stage. Therefore, the insulated gate bipolar transistor first operates in the MOSFET mode. After a voltage reaches VsB, the insulated gate bipolar transistor quickly enters the IGBT mode from the MOSFET mode, where the insulated gate bipolar transistor stays in the MOSFET mode for a very short time. Because an MCU operates in a light load state most of time, the MCU expects that a switching element (the insulated gate bipolar transistor) of an inverter operates in the MOSFET mode more time. In addition, when the MCU is in full load, the MCU expects that the insulated gate bipolar transistor can quickly switch to the IGBT mode. Therefore, from a perspective of improving MCU efficiency, the MCU expects that an operation mode of the switching element can be more accurately controlled.

In view of this, the insulated gate bipolar transistor provided in this embodiment further provides another power supply mode: supplying power to only the first metal electrode 15 or the second metal electrode 14. It can be learned from the foregoing structure of the insulated gate bipolar transistor that, when the structure in which the first metal electrode 15 is electrically connected to only the collector 12, the second metal electrode 14 is electrically connected to only the drain 13, and the first metal electrode 15 is electrically isolated from the second metal electrode 14 is used, the back surface of the insulated gate bipolar transistor is divided into two regions through electrical isolation between the first metal electrode 15 and the second metal electrode 14: an IGBT region and a MOSFET region. During use, power may be separately supplied to the IGBT region and the MOSFET region to control the insulated gate bipolar transistor. For example, when power is supplied to only the first metal electrode 15, only the collector 12 is conducted, and the drain 13 is not conducted. In this case, the insulated gate bipolar transistor can implement the IGBT mode and the MOSFET mode. When power is supplied to only the second metal electrode 14, only the drain 13 is conducted, and the collector 12 is not conducted. In this case, the insulated gate bipolar transistor can implement the FRD mode and the MOSFET mode. When the MCU is in light load, power may be supplied to only the second metal electrode 14. In this case, the MCU can operate in the MOSFET mode for a long time. When the MCU is in heavy load, power may be supplied to both the first metal electrode 15 and the second metal electrode 14. In this case, the MCU can switch between the MOSFET mode and the IGBT mode. It can be learned from the foregoing description that, the MCU can accurately control the operating mode of the device by using the two metal electrodes on the back surface together with the gate 8. Based on a power output requirement of the MCU, it is determined whether the insulated gate bipolar transistor operates in the MOSFET mode or the IGBT mode. Therefore, a motor can be more accurately controlled.

As an optional implementation, a width of the collector 12 is made greater than a width of the drain 13, so that an electron hole can be easily injected from the collector 12. Therefore, a small fast recovery voltage and a small conduction resistance can be implemented. As a condition for reducing a fast recovery voltage, in a current density at a fast recovery peak voltage, a voltage drop needs to be caused for the buffer layer 11 in the horizontal direction of FIG. 1, so that a potential difference between a middle point of the collector 12 and the drain 13 becomes greater than or equal to 0.5 V, and preferably, greater than or equal to 0.7 V. To meet the foregoing condition, a larger width of the collector 12 (in the first direction a in FIG. 1) is obtained, so that an electron hole can be easily injected from the first metal electrode 15. Therefore, MOSFET characteristics, namely, a relatively small fast recovery voltage and a relatively small conduction resistance are implemented. In addition, a relatively large MOSFET operation range can be obtained.

In addition, a larger repetition spacing between the collector 12 and the drain 13 enables a fast recovery voltage to be smaller. Preferably, a repetition spacing between the collector 12 and the drain 13 is greater than or equal to 5 times a repetition spacing between the N-drift layer 1 and the P-drift layer 2 and is less than 20,000 times the repetition spacing between the N-drift layer 1 and the P-drift layer 2.

As a variant embodiment, in addition to the foregoing trench gate structure, the insulated gate bipolar transistor provided in this embodiment may be of a planar gate structure, provided that device characteristics of the IGBT can be implemented.

Figure 4:
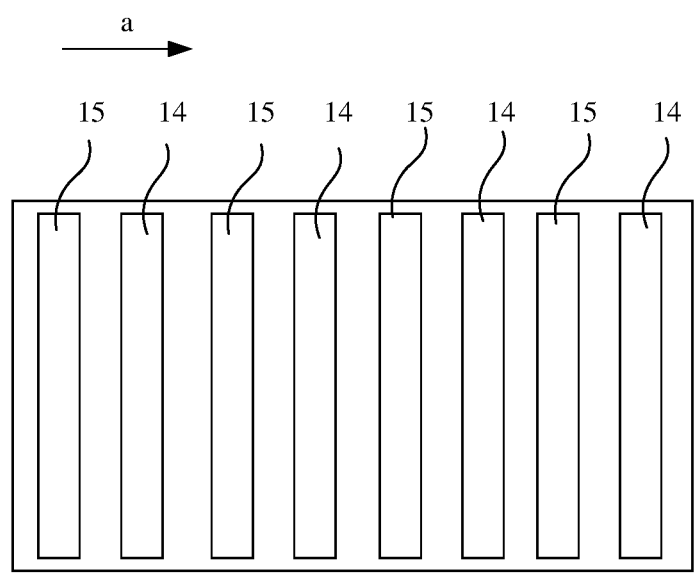
FIG. 4 is another top view of an insulated gate bipolar transistor according to an embodiment of this application.

FIG. 4 shows another insulated gate bipolar transistor. There are a plurality of collectors and a plurality of drains, and the plurality of collectors and the plurality of drains are alternately arranged. Correspondingly, first metal electrodes 15 are in a one-to-one correspondence with the collectors 12, second metal electrodes 14 are in a one-to-one correspondence with the drains, and any adjacent first metal electrode 15 and second metal electrode 14 are electrically isolated from each other. As shown in FIG. 4, the first metal electrodes 15 and the second metal electrodes 14 are alternately arranged in the first direction a.

Figure 5:
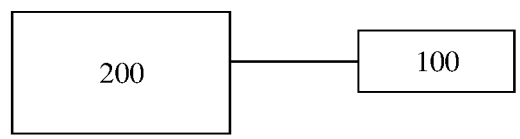
FIG. 5 is a block diagram of a structure of a motor control unit according to an embodiment of this application.

As shown in FIG. 5, an embodiment of this application further provides a motor control unit. The motor control unit includes a power module 200 and the insulated gate bipolar transistor 100 that is connected to the power module 200 and that is described in any one of the foregoing embodiments. The motor control unit may be configured to control a motor to operate. Because the MCU operates in a light load state most of time, the MCU expects that a switching element (the insulated gate bipolar transistor 100) of an inverter operates in a MOSFET mode more time. In addition, when the MCU is in full load, the MCU expects that the insulated gate bipolar transistor 100 can quickly switch to an IGBT mode. Therefore, a back surface of the insulated gate bipolar transistor 100 is divided into two regions through electrical isolation between the first metal electrode and the second metal electrode: an IGBT region and a MOSFET region. During use, power may be separately supplied to the IGBT region and the MOSFET region to control the insulated gate bipolar transistor 100. For example, when power is supplied to only the first metal electrode, only the collector is conducted, and the drain is not conducted. In this case, the insulated gate bipolar transistor 100 can implement the IGBT mode and the MOSFET mode. When power is supplied to only the second metal electrode, only the drain is conducted, and the collector is not conducted. In this case, the insulated gate bipolar transistor 100 can implement an FRD mode and the MOSFET mode. When the MCU is in light load, power may be supplied to only the second metal electrode. In this case, the MCU can operate in the MOSFET mode for a long time. When the MCU is in heavy load, power may be supplied to both the first metal electrode and the second metal electrode. In this case, the MCU can switch between the MOSFET mode and the IGBT mode. It can be learned from the foregoing description that, the MCU can accurately control an operating mode of the device by using the two metal electrodes on the back surface together with the gate. Based on a power output requirement of the MCU, it is determined whether the insulated gate bipolar transistor 100 operates in the MOSFET mode or the IGBT mode. Therefore, the motor can be more accurately controlled.

Figure 6:
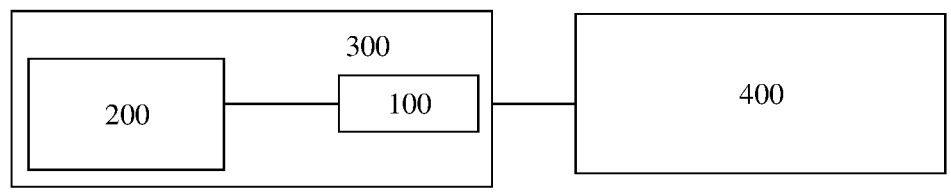
FIG. 6 is a block diagram of a structure of motor control in a vehicle according to an embodiment of this application.

As shown in FIG. 6, an embodiment of this application provides a vehicle. For same reference signs in FIG. 6, refer to the descriptions in FIG. 5. The vehicle includes a motor 400 and a motor control unit 300 that is connected to the motor 400 and that is described in any one of the foregoing embodiments. The motor control unit 300 may be configured to control the motor 400 to operate. Because the MCU operates in a light load state most of time, the MCU expects that a switching element (the insulated gate bipolar transistor 100) of an inverter operates in a MOSFET mode more time. In addition, when the MCU is in full load, the MCU expects that the insulated gate bipolar transistor 100 can quickly switch to an IGBT mode. Therefore, a back surface of the insulated gate bipolar transistor 100 is divided into two regions through electrical isolation between the first metal electrode and the second metal electrode: an IGBT region and a MOSFET region. During use, power may be separately supplied to the IGBT region and the MOSFET region to control the insulated gate bipolar transistor 100. For example, when power is supplied to only the first metal electrode, only the collector is conducted, and the drain is not conducted. In this case, the insulated gate bipolar transistor 100 can implement the IGBT mode and the MOSFET mode. When power is supplied to only the second metal electrode, only the drain is conducted, and the collector is not conducted. In this case, the insulated gate bipolar transistor 100 can implement an FRD mode and the MOSFET mode. When the MCU is in light load, power may be supplied to only the second metal electrode. In this case, the MCU can operate in the MOSFET mode for a long time. When the MCU is in heavy load, power may be supplied to both the first metal electrode and the second metal electrode. In this case, the MCU can switch between the MOSFET mode and the IGBT mode. It can be learned from the foregoing description that, the MCU can accurately control an operating mode of the device by using the two metal electrodes on the back surface together with the gate. Based on a power output requirement of the MCU, it is determined whether the insulated gate bipolar transistor 100 operates in the MOSFET mode or the IGBT mode. Therefore, the motor 400 can be more accurately controlled.

Obviously, a person skilled in the art can make various modifications and variations to this application without departing from the spirit and scope of this application. This application is intended to cover these modifications and variations of this application provided that they fall within the scope of protection defined by the claims and their equivalent technologies.

What is claimed is:

1. An insulated gate bipolar transistor (IGBT), comprising an IGBT device structure feature layer, a super-junction (SJ) device structure feature layer, and a Reverse-Conduction Insulated Gate Bipolar Transistor (RC-IGBT) device structure feature layer, wherein
the IGBT device structure feature layer, the SJ device structure feature layer, and the RC-IGBT device structure feature layer are laminated, and the IGBT device structure feature layer and the RC-IGBT device structure feature layer are respectively arranged on two opposite sides of the SJ device structure feature layer;
the RC-IGBT device structure feature layer comprises a collector and a drain that are disposed at physically separate regions of a same layer; and
the insulated gate bipolar transistor further comprises a first metal electrode laminated with and electrically connected to the collector, and a second metal electrode laminated with and electrically connected to the drain, and the first metal electrode is spatially separated from and electrically isolated from the second metal electrode.

2. The insulated gate bipolar transistor according to claim 1, wherein the SJ device structure feature layer comprises a drift layer, a super-junction structure layer, and a buffer layer that are laminated, and the super-junction structure layer is located between the drift layer and the buffer layer;
the drift layer is connected to the IGBT device structure feature layer; and
the buffer layer is connected to the collector and the drain.

3. The insulated gate bipolar transistor according to claim 2, wherein the buffer layer is an N-type buffer layer.

4. The insulated gate bipolar transistor according to claim 2, wherein the drift layer is an N-drift layer.

5. The insulated gate bipolar transistor according to claim 2, wherein the super-junction structure layer comprises a plurality of N-drift layers and a plurality of P-drift layers, the plurality of N-drift layers and the plurality of P-drift layers are alternately arranged in a first direction, and the first direction is perpendicular to a second direction; and
the second direction is a direction in which the IGBT device structure feature layer is laminated with the SJ device structure feature layer.

6. The insulated gate bipolar transistor according to claim 3, wherein the super-junction structure layer comprises a plurality of N-drift layers and a plurality of P-drift layers, the plurality of N-drift layers and the plurality of P-drift layers are alternately arranged in a first direction, and the first direction is perpendicular to a second direction; and
the second direction is a direction in which the IGBT device structure feature layer is laminated with the SJ device structure feature layer.

7. The insulated gate bipolar transistor according to claim 4, wherein the super-junction structure layer comprises a plurality of N-drift layers and a plurality of P-drift layers, the plurality of N-drift layers and the plurality of P-drift layers are alternately arranged in a first direction, and the first direction is perpendicular to a second direction; and
the second direction is a direction in which the IGBT device structure feature layer is laminated with the SJ device structure feature layer.

8. The insulated gate bipolar transistor according to claim 2, wherein the IGBT device structure feature layer comprises:
a P base layer laminated with the drift layer, and a front emitter laminated with the P base layer; and
a plurality of gates that are penetrated through the P base layer and inserted into the drift layer, an insulating gate film that wraps each gate, an interlayer insulating film that insulates each gate from the front emitter, and an N emitter layer and a P+ contact layer that are disposed on a surface of the P base layer.

9. The insulated gate bipolar transistor according to claim 3, wherein the IGBT device structure feature layer comprises:
a P base layer laminated with the drift layer, and a front emitter laminated with the P base layer; and
a plurality of gates that are penetrated through the P base layer and inserted into the drift layer, an insulating gate film that wraps each gate, an interlayer insulating film that insulates each gate from the front emitter, and an N emitter layer and a P+ contact layer that are disposed on a surface of the P base layer.

10. The insulated gate bipolar transistor according to claim 4, wherein the IGBT device structure feature layer comprises:
a P base layer laminated with the drift layer, and a front emitter laminated with the P base layer; and
a plurality of gates that are penetrated through the P base layer and inserted into the drift layer, an insulating gate film that wraps each gate, an interlayer insulating film that insulates each gate from the front emitter, and an N emitter layer and a P+ contact layer that are disposed on a surface of the P base layer.

11. The insulated gate bipolar transistor according to claim 1, wherein the first metal electrode is in ohmic contact with the collector; and/or
the second metal electrode is in ohmic contact with the drain.

12. The insulated gate bipolar transistor according to claim 1, wherein the first metal electrode is spaced apart from the second metal electrode.

13. The insulated gate bipolar transistor according to claim 1, further comprising a plurality of collectors and a plurality of drains, and the plurality of collectors and the plurality of drains are alternately arranged.

14. The insulated gate bipolar transistor according to claim 13, wherein first metal electrodes are in a one-to-one correspondence with the plurality of collectors, second metal electrodes are in a one-to-one correspondence with the plurality of drains, and any adjacent first metal electrode and second metal electrode are electrically isolated from each other.

15. The insulated gate bipolar transistor according to claim 2, wherein the IGBT device structure feature layer comprises a P base layer, the P base layer is laminated with the drift layer in a direction in which the IGBT device structure feature layer is laminated with the SJ device structure feature layer.

16. The insulated gate bipolar transistor according to claim 1, wherein the collector has a width greater than a width of the drain.

17. The insulated gate bipolar transistor according to claim 1, wherein the collector and the drain are configured to be separately powered to control the insulated gate bipolar transistor to operate in different modes.

18. The insulated gate bipolar transistor according to claim 1, wherein the first metal electrode and the second metal electrode divide a back surface of the insulated gate bipolar transistor into an IGBT region and a MOSFET region.

19. A motor controller, comprising a power module and an insulated gate bipolar transistor (IGBT) that is connected to the power module, wherein the insulated gate bipolar transistor (IGBT) comprises an IGBT device structure feature layer, a super-junction (SJ) device structure feature layer, and a Reverse-Conduction Insulated Gate Bipolar Transistor (RC-IGBT) device structure feature layer, wherein
- the IGBT device structure feature layer, the SJ device structure feature layer, and the RC-IGBT device structure feature layer are laminated, and the IGBT device structure feature layer and the RC-IGBT device structure feature layer are respectively arranged on two opposite sides of the SJ device structure feature layer;
- the RC-IGBT device structure feature layer comprises a collector and a drain that are disposed at physically separate regions of a same layer; and
- the insulated gate bipolar transistor further comprises a first metal electrode laminated with and electrically connected to the collector, and a second metal electrode laminated with and electrically connected to the drain, and the first metal electrode being spatially separated from and electrically isolated from the second metal electrode.

\* \* \* \* \*